United States Patent
Lin

(10) Patent No.: US 11,222,838 B2
(45) Date of Patent: Jan. 11, 2022

(54) EMBEDDED COMPONENT SUBSTRATE STRUCTURE HAVING BRIDGE CHIP AND METHOD FOR MANUFACTURING THE SAME

(71) Applicant: UNIMICRON TECHNOLOGY CORPORATION, Taoyuan (TW)

(72) Inventor: Chien-Chen Lin, Taoyuan (TW)

(73) Assignee: UNIMICRON TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 16/944,179

(22) Filed: Jul. 31, 2020

(65) Prior Publication Data

US 2021/0375737 A1    Dec. 2, 2021

(30) Foreign Application Priority Data

May 28, 2020    (TW) ................................. 109117862

(51) Int. Cl.
*H01L 23/498* (2006.01)
*H01L 21/48* (2006.01)

(52) U.S. Cl.
CPC .... *H01L 23/49838* (2013.01); *H01L 21/4853* (2013.01); *H01L 21/4857* (2013.01); *H01L 23/49811* (2013.01)

(58) Field of Classification Search
CPC .......... H01L 23/49838; H01L 21/4853; H01L 21/4857; H01L 23/49811
See application file for complete search history.

(56) References Cited

U.S. PATENT DOCUMENTS

| | | | |
|---|---|---|---|
| 2018/0053723 A1* | 2/2018 | Hu | H01L 24/16 |
| 2021/0074691 A1* | 3/2021 | Lee | H01L 25/50 |
| 2021/0082797 A1* | 3/2021 | Lee | H01L 23/49811 |
| 2021/0098421 A1* | 4/2021 | Wu | H01L 25/0652 |
| 2021/0125882 A1* | 4/2021 | Oh | H01L 21/4857 |
| 2021/0159141 A1* | 5/2021 | Sikka | H01L 24/16 |

FOREIGN PATENT DOCUMENTS

| | | |
|---|---|---|
| TW | I418265 B | 12/2013 |
| TW | I545997 B | 8/2016 |

* cited by examiner

*Primary Examiner* — Michael Jung

(57) ABSTRACT

An embedded component substrate structure and a method for manufacturing the same, with a carrier structure being formed with a groove on a top, and a chip structure with a plurality of conductors disposed in the groove. Dielectric layers are disposed on a top and a bottom of the carrier structure, and two opposite ends of multiple circuits in the carrier structure are exposed to the dielectric layers. Circuit build-up structures are disposed on the dielectric layers, and electrically connect to the circuits of the carrier structure.

8 Claims, 11 Drawing Sheets

EMBEDDED COMPONENT SUBSTRATE STRUCTURE HAVING BRIDGE CHIP AND METHOD FOR MANUFACTURING THE SAME

CROSS-REFERENCE TO RELATED APPLICATION

This non-provisional application claims priority under 35 U.S.C. § 119(a) on Patent Application No(s). 109117862 filed in Taiwan, R.O.C. on May 28, 2020, the entire contents of which are hereby incorporated by reference.

BACKGROUND OF THE INVENTION

1. Field of the Invention

The present disclosure relates to a substrate structure and a method for manufacturing the same, and in particular to an embedded component substrate structure and a method for manufacturing the same.

2. Description of the Related Art

Because of the rapid development and change of social patterns, the lifestyle of ordinary people changes with it, the electronic industries that are applied in different fields such as the Internet of Things (IoT), 5G mobile communication (5th generation mobile networks, 5th generation wireless systems, 5G), biotechnology, artificial intelligence chip (AI chip) and others also have experienced rapid growth. These rapidly growing electronics industries create many electronic products with more advanced features and better quality through performance improvements from cooperation of many components which are set up to improve the quality of life of ordinary people, convenience, or connection of related network services.

Components in an electronic product are generally a combination of one or more chips that have one or more electronic components or one or more processors inside, and then the components are assembled and electrically connected to complete the electronic product. For the fabrication of components, the conventional method comprises steps of setting up the chip on a top surface of a carrier structure, setting up a dielectric layer on the carrier structure and the chip to cover the top surface of the chip and the carrier structure, and then drilling out laser perforations on the dielectric layer that correspond to multiple contacts of the chip through laser drilling, and fabricating the contacts for connecting the chip and multiple pins exposed to the dielectric layer in these laser perforations, electrically connecting the pins to pins of other chips or circuits to complete fabrication of components.

In designing a chip, in order to improve the performance of the chip, more electronic components or processors are set up in a limited size to improve the performance of the chip, with the setting of many electronic components or processors, the chip needs to set up many exposed contacts for connection with other chips or circuits of the components. Because the size of the chip is limited, the exposed contacts are very densely arranged, and limited to the precision limitation of the laser drilling equipment and problems with thermal reaming the hole, so that the hole size and position of the laser perforations are unstable and easily influence adjacent laser perforations. As a result, adjacent pins may be connected to each other during the pin setting process, so that short circuits may occur, and the pins may not be actually connected to the contacts, so as to cause open connections, resulting in chip failure and reduced reliability.

The related art, as disclosed in the patent publication TWI545997 of the Republic of China (hereinafter referred to as document 1), an interposer substrate and method for making the same disclosed that an insulating layer is formed on a carrier with a circuit layer, and then a circuit build-up structure which is electrically connecting is formed on the insulating layer and the circuit layer, and then an external connecting pillar is formed on the circuit build-up structure and electrically connecting with it. However, document 1 fails to disclose how to fabricate the corresponding contacts of the chip on the carrier structure and connect to other chips.

In addition, as disclosed in the patent publication TWI418265 of the Republic of China (hereinafter referred to as document 2), a package structure comprises a carrier having a through hole and a metallic layer covering one side of the hole, a semiconductor chip accommodated in the hole and disposed on the metallic layer, a stud bump disposed on the semiconductor chip, a dielectric layer covering the carrier and the semiconductor chip while encapsulating the stud bump, a circuit layer disposed on the dielectric layer and electrically connected to the stud bump, and a protective layer disposed on the dielectric layer and the circuit layer, thereby using the stud bump as a component for transmitting signals. However, the document 2 fails to disclose the content how to fabricate the corresponding contacts of the chip set up on the carrier structure and connecting to other chips.

BRIEF SUMMARY OF THE INVENTION

In view of the problems that exist in the above-mentioned state of the art, an objective of the invention is to provide an embedded component substrate structure and a method for manufacturing the same, with a chip having pre-made conductors on a carrier structure, after being covered with a dielectric layer, only the conductors are exposed through the dielectric layer for connection with other chips. Since it is not necessary to additionally fabricate laser perforations for the conductors on the dielectric layer by laser drilling, short circuiting of adjacent conductors or empty conductor connections because of limited laser drilling accuracy of thermal reaming holes, so as to achieve the purpose of improving reliability and stability.

To achieve the above objective, the present disclosure takes a main technical means regarding an embedded component substrate structure, which comprises the following structure.

The structure comprises a carrier structure, and the carrier structure has a top and an opposite bottom, and a plurality of first circuits and a plurality of second circuits. The carrier structure is recessed to form a holding groove on the top. The first circuits and the second circuits are disposed within the carrier structure. The second circuits respectively have a first end and an opposite second end, the first ends of the second circuits are exposed on the top of the carrier structure, and the second ends of the second circuits are exposed on the bottom of the carrier structure.

The structures comprise a first dielectric layer, and the first dielectric layer is disposed on the bottom of the carrier structure, and the second ends of the second circuits of the carrier structure are exposed on the first dielectric layer.

The structure comprises a chip structure with preset multiple conductors, and the chip structure is disposed in the holding groove.

The structure comprises a second dielectric layer, the second dielectric layer is disposed on the chip structure and the top of the carrier structure, and the conductors of the chip structure and the first ends of the second circuits are exposed on the second dielectric layer.

The structure comprises a first circuit build-up structure, the first circuit build-up structure is disposed on the second dielectric layer, the conductors of the chip structure and the first ends of the second circuits, and respectively electrically connects the corresponding conductors on the chip structure and the corresponding first ends of the second circuits on the carrier structure.

The structure comprises a second circuit build-up structure, the second circuit build-up structure is disposed on the bottom of the carrier structure, and respectively electrically connects the corresponding second ends of the second circuits on the carrier structure.

In an embodiment, the chip structure comprises a bridge chip and a conductor structure. The bridge chip has a top and an opposite bottom and a plurality of circuits and a plurality of conductive contacts, the circuits are disposed in the bridge chip, and the contacts are alternately disposed on the top of the bridge chip. The conductor structure has a fixed layer and the above-mentioned conductors, the fixed layer has a top and an opposite bottom, the conductors respectively have a first end and an opposite second end, and are respectively exposed on the top and the bottom of the fixed layer, the bottom of the conductor structure is set up on the top of the bridge chip, and the second ends of the conductors respectively electrically connect the corresponding contacts on the bridge chip.

In an embodiment, an adhesive layer is provided, which is disposed in the holding groove, and the adhesive layer lies between the chip structure and the carrier structure.

In an embodiment, an electrical connection layer is provided, which is disposed on the first circuit build-up structure, and the electrical connection layers respectively electrically connect the corresponding first ends on the second circuits and the corresponding conductors of the chip structure through the first circuit build-up structure.

In an embodiment, at least one chip is provided, the chip has a plurality of contacts, and is disposed on the top of the carrier structure, the contacts of the chip respectively electrically connect the corresponding second circuits and the corresponding conductors on the chip structure through the electrical connection layer.

According to the above structure, the chip structure with the conductors that are disposed and made in advance by a semiconductor process is fixed in the holding groove of the carrier structure. The second dielectric layer is disposed on the top of the carrier structure to protect the chip structure, and the conductors of the chip structure are exposed on the second dielectric layer. Since it is not necessary to fabricate corresponding laser through holes on the dielectric layer at the top of the carrier structure by laser drilling, short circuiting of adjacent conductors is prevented or empty contact connections because of the limits of accuracy with laser drilling and thermal reaming holes is avoided, so as to achieve the purpose of improving reliability and stability.

To achieve the above objective, the present invention takes a main technical means regarding to a method for manufacturing an embedded component substrate structure, which comprises the following steps.

The steps comprise: recessing a carrier structure to form a holding groove on a top, and the carrier structure has a plurality of first circuits and a plurality of second circuits therein, exposing first ends of the second circuits on the top of the carrier structure, and exposing second ends of the second circuits on a bottom of the carrier structure.

The steps further comprise: providing a first dielectric layer on the bottom of the carrier structure.

The steps further comprise: providing a chip structure with preset multiple conductors in the holding groove of the carrier structure.

The steps further comprise: setting up a second dielectric layer on the top of the carrier structure and the chip structure.

The steps further comprise: exposing the conductors of the chip structure and the first ends of the second circuits of the carrier structure on the second dielectric layer, and providing a first circuit build-up structure on the second dielectric layer, the conductors of the chip structure and the first ends of the second circuits of the carrier structure, and electrically connecting the corresponding conductors on the chip structure and the corresponding first ends of the second circuits on the carrier structure.

The steps further comprise: exposing the second ends of the second circuits of the carrier structure on the first dielectric layer, and setting up a second circuit build-up structure on the first dielectric layer and the second ends of the second circuits of the carrier structure, and electrically connecting the corresponding second ends of the second circuits on the carrier structure.

In an embodiment, the chip structure comprises a bridge chip and a conductor structure. The bridge chip has a top and an opposite bottom and a plurality of circuits and a plurality of contacts, the circuits are disposed in the bridge chip, and the contacts are alternately disposed on the top of the bridge chip, and the conductor structure has a fixed layer and the above-mentioned conductors. The steps for forming the chip structure comprise: providing the fixed layer on a carrying piece, and forming a plurality of perforated through holes in a top and a bottom of the fixed layer; providing the conductors in the plurality of through holes of the fixed layer, and first ends of the conductors are respectively in contact with the carrying piece, and second ends of the conductors are respectively exposed on the bottom of the fixed layer; providing the top of the bridge chip on the bottom of the fixed layer, and respectively electrically connecting the second ends of the conductors to the corresponding contacts on the bridge chip; removing the carrying piece; removing the top of the fixed layer to expose the first ends of the conductors.

In an embodiment, before the chip structure is disposed in the holding groove of the carrier structure, an adhesive layer is disposed in the holding groove, and then the chip structure is disposed on the adhesive layer in the holding groove.

In an embodiment, the steps further comprise: disposing an electrical connection layer on the first circuit build-up structure.

In an embodiment, at least one chip is further included, and the chip has a plurality of contacts, and the step for providing the chip comprise: disposing the chip on the top of the carrier structure, and respectively electrically connecting the contacts of the chip to the corresponding first ends of the second circuits of the carrier structure and the corresponding conductors of the chip structure through the electrical connection layer.

According to the above method, the chip structure with the conductors that are provided and made in advance by a semiconductor process is fixed in the holding groove of the carrier structure, and the second dielectric layer is disposed on the top of the carrier structure to protect the chip structure, and the conductors of the chip structure are exposed on the second dielectric layer. Since it is not necessary to fabricate corresponding laser through holes on the dielectric layer at the top of the carrier structure by laser drilling, short circuiting of adjacent conductors is prevented or empty conductor connections because of the limits of accuracy of the laser drilling and thermal reaming holes, so as to achieve the purpose of improving reliability and stability.

DETAILED DESCRIPTION OF THE INVENTION

Figure 1:
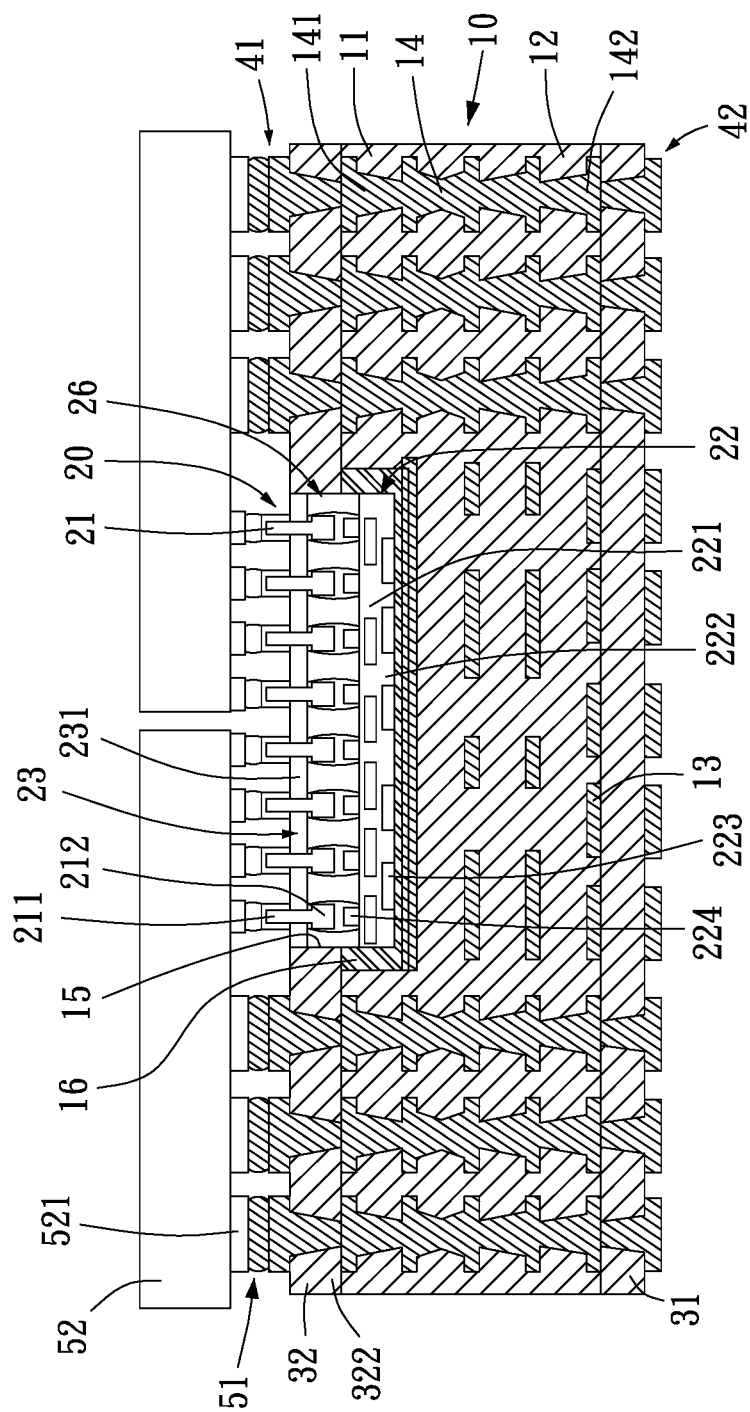
FIG. 1 is a schematic view of an embedded component substrate structure of the present disclosure.

The drawings shown in the present invention are all local sectional views of the carrier structure, and the quantity and size of the related structures presented in the drawings are for reference only, and are not intended to limit the concrete structure of the carrier structure of the present invention. In addition, the direction relationship described in the present invention is based on the description of the direction indicated in the drawings, and is not limited.

As to an embodiment of an embedded component substrate structure of the invention, referring to FIG. 1, the substrate structure comprises a carrier structure 10, a chip structure 20 with preset plurality of wire pieces 21, a first dielectric layer 31, a second dielectric layer 32, a first circuit build-up structure 41 and a second circuit build-up structure 42. The carrier structure 10 has a top 11 and an opposite bottom 12. The chip structure 20, the second dielectric layer 32 and the first circuit build-up structure 41 are disposed on the top 11 of the carrier structure 10; the first dielectric layer 31 and the second circuit build-up structure 42 are disposed on the bottom 12 of the carrier structure 10.

Figure 2:
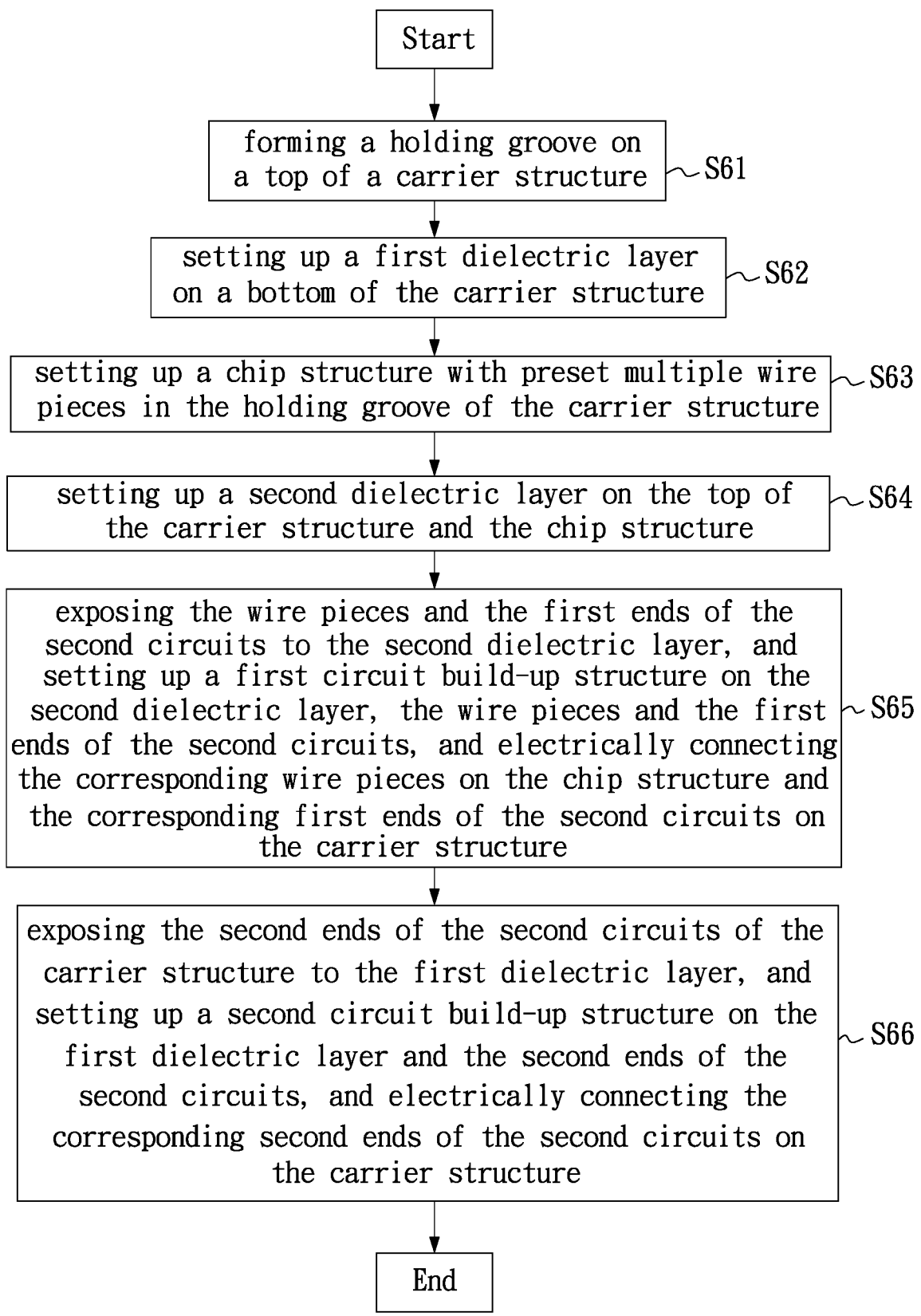
FIG. 2 is a schematic flow sheet of a method for manufacturing an embedded component substrate structure of the present disclosure.

In order to illustrate the concrete structure of the embedded component substrate structure of the present invention and the corresponding manufacturing method, please also refer to the flow sheet of the manufacturing method of the embedded component substrate structure shown as FIG. 2. The relative relationship, setup method and connection relationship of the related structure are also explained by explaining the manufacturing method of the substrate structure.

Figure 3:
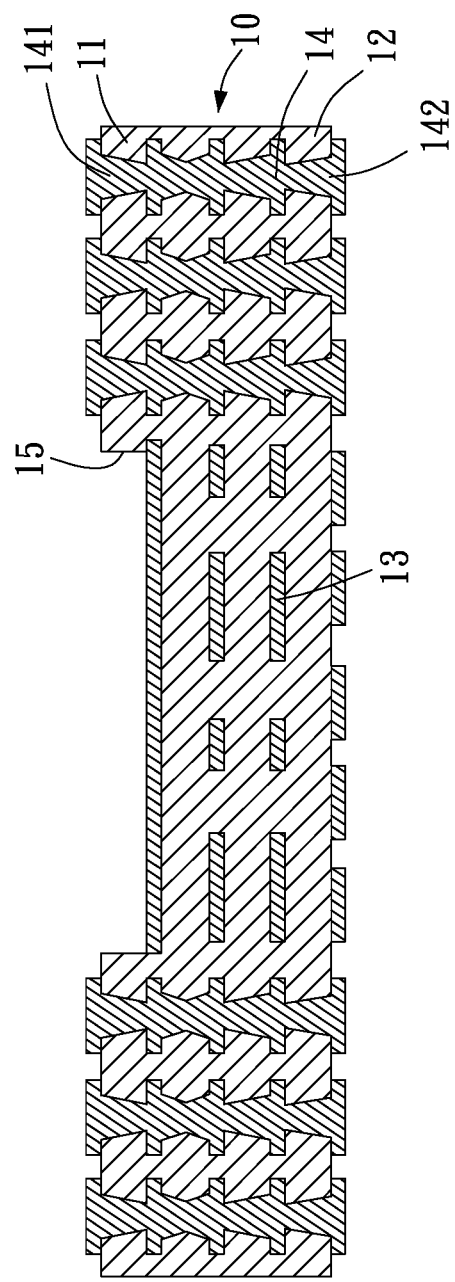
FIG. 3 is a schematic view of a carrier structure of the present disclosure.

As to the structure of the carrier structure 10, referring to FIGS. 1 to 3, the carrier structure 10 has the top 11 and the bottom 12, the carrier structure 10 further has a plurality of first circuits 13 and a plurality of second circuits 14, the second circuits 14 respectively have a first end 141 and a second end 142 which are opposite, the first circuits 13 and the second circuits 14 are disposed within the carrier structure 10, and the first ends 141 of the second circuits 14 of the carrier structure 10 are respectively exposed on the top 11 of the carrier structure 10; the second ends 142 of the second circuits 14 of the carrier structure 10 are respectively exposed on the bottom 12 of the carrier structure 10. In order to make the carrier structure 10 accommodate or set up the chip structure 20, shown as step S61, the carrier structure 10 is recessed to form a holding groove 15 on the top 11, wherein the position of the holding groove 15 may be but not limited to being provided in the middle position on the top 11 of the carrier structure 10. In the embodiment, the carrier structure 10 may be a printed circuit board or a substrate pre-made with a circuit.

Figure 4:
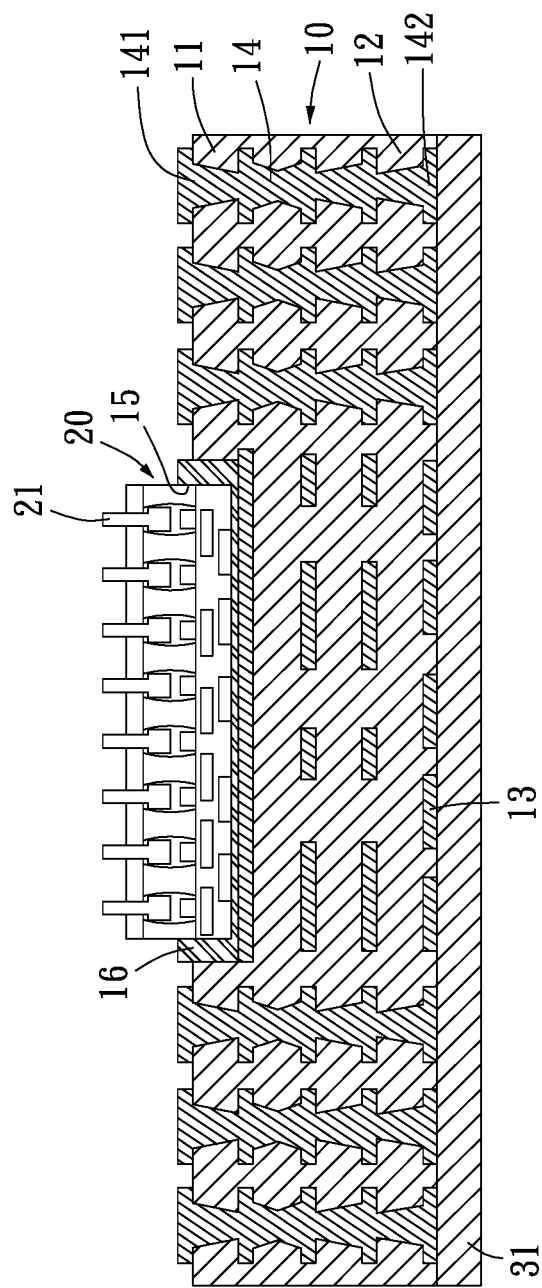
FIG. 4 is a schematic view of a chip structure and a first dielectric layer disposed on the carrier structure of the present disclosure.

Further, referring to FIGS. 1, 2 and 4, shown as step S62, the first dielectric layer 31 is disposed on the bottom 12 of the carrier structure 10, and the first dielectric layer 31 covers the second ends 142 of the second circuits 14. After the step S62 is completed, shown as step S63, the chip structure 20 with preset multiple conductors 21 is disposed in the holding groove 15 of the carrier structure 10, so that the chip structure 20 is disposed on the top 11 of the carrier structures 10. In order to strengthen the binding strength of the chip structure 20 with the carrier structure 10, before the step S63 that the chip structure 20 with preset multiple conductors 21 is disposed in the holding groove 15 of the carrier structure 10, an adhesive layer 16 is disposed in the holding groove 15, and then the chip structure 20 is disposed on the adhesive layer 16 in the holding groove 15, so that the effect of reinforced binding of the adhesive layer 16 between the chip structure 20 and the carrier structure 10 can be achieved.

In the embodiment, the first dielectric layer 31 may be a dielectric oxide film (e.g. silicon dioxide, etc.), an epoxy resin, etc., and is made by a film fabricating method (e.g. sputter deposition/coating, deposition or coating).

Figure 5:
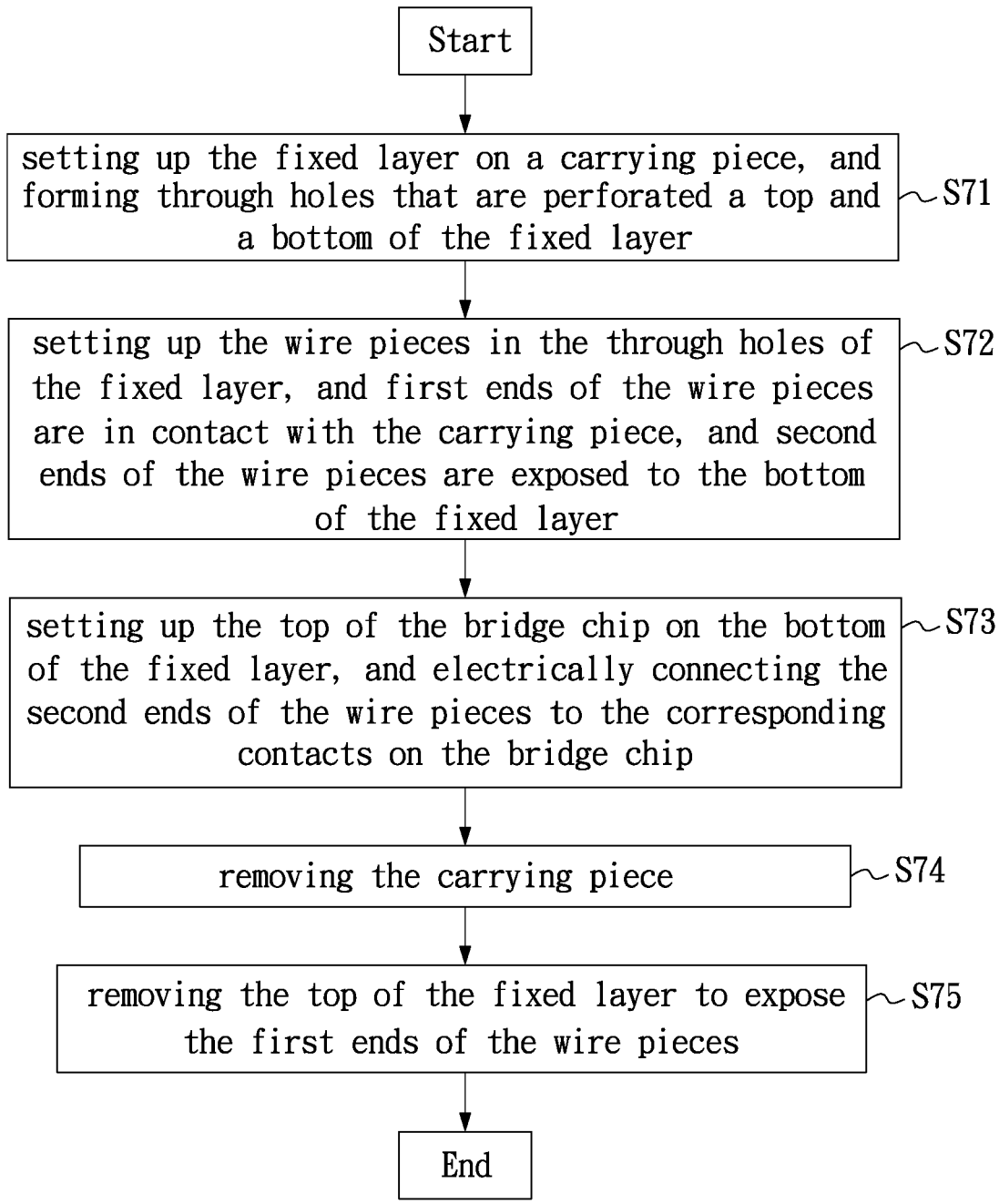
FIG. 5 is a schematic flow sheet of forming the chip structure of the present disclosure.
Figure 6:
FIG. 6 is a schematic flow sheet of a first fabrication of the chip structure of the present disclosure.

In order to illustrate a concrete manufacturing process that shows how to form the chip structure 20 with preset multiple conductors 21 and the connection relationship of the related structure, please refer to FIGS. 1, 5 and 6. The chip structure 20 comprises a bridge chip 22 and a conductor structure 23. The bridge chip 22 has a top 221 and an opposite bottom 222 and a plurality of circuits 223 and a plurality of contacts 224, the circuits 223 are disposed in the bridge chip 22, and the contacts 224 are alternately disposed on the top 221 of the bridge chip 22, and the conductor structure 23 has a fixed layer 231 and the above-mentioned conductors 21.

Figure 7:
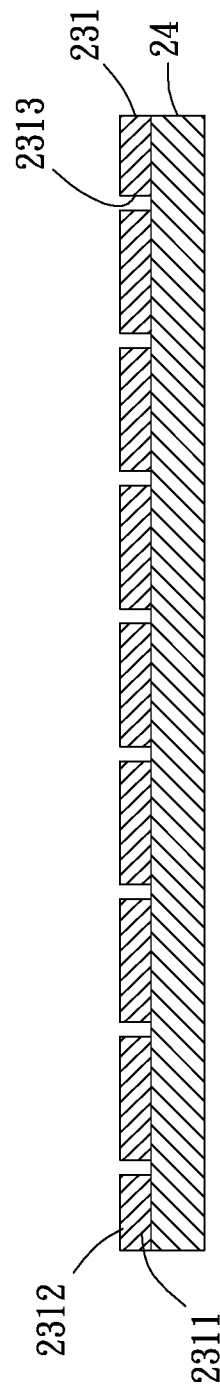
FIG. 7 is a schematic flow sheet of a second fabrication of the chip structure of the present disclosure.

In the embodiment, referring to FIGS. 5-7, a carrying piece 24 is provided first, and shown as step S71, the fixed layer 231 is formed on the carrying piece 24, and multiple through holes 2313 are formed on the fixed layer 231 that are arranged alternately and perforate a top 2311 and a bottom 2312 of the fixed layer 231. The top 2311 of the fixed layers 231 is in contact with the carrying piece 24. The fixed layer 231 may be a dielectric oxide film (e.g. silicon dioxide, etc.), an epoxy resin, etc., and is made by a film fabricating method (e.g. sputter deposition/coating, deposition or coating). The through holes 2313 may be made by an etching method.

Figure 8:
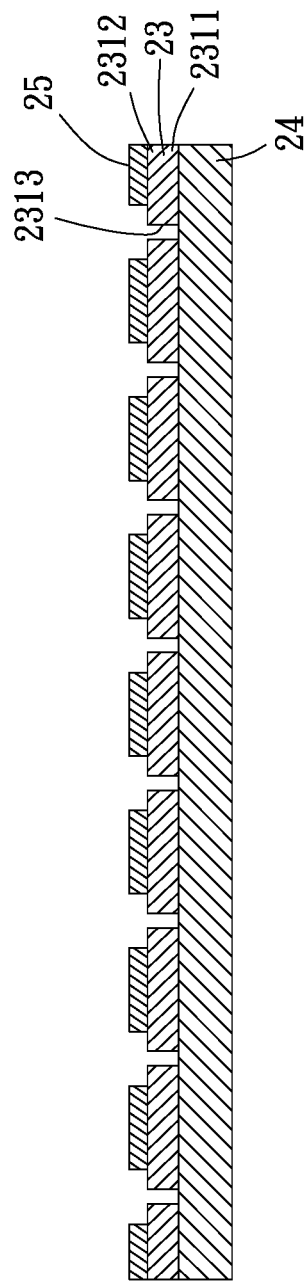
FIG. 8 is a schematic flow sheet of a third fabrication of the chip structure of the present disclosure.
Figure 9:
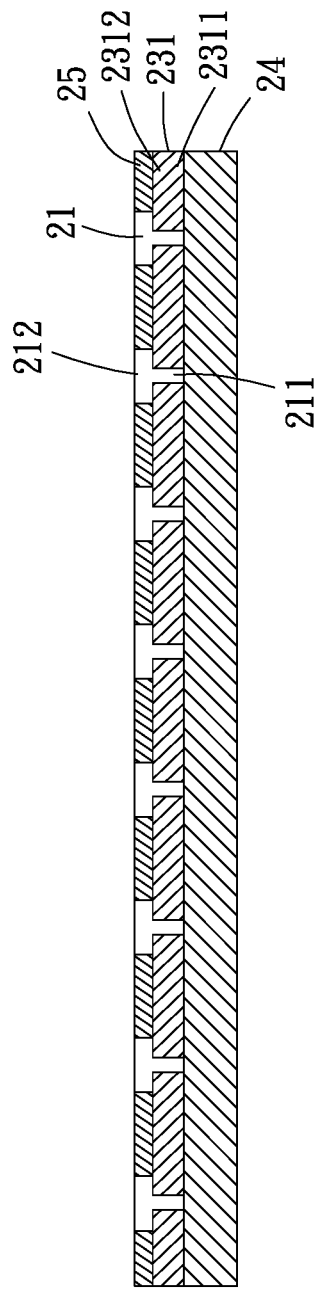
FIG. 9 is a schematic flow sheet of a fourth fabrication of the chip structure of the present disclosure.
Figure 10:
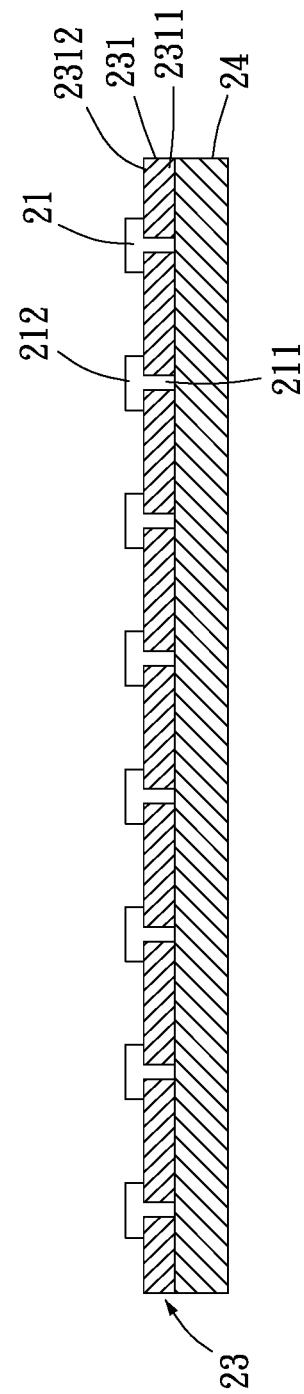
FIG. 10 is a schematic flow sheet of a fifth fabrication of the chip structure of the present disclosure.

In an embodiment, referring to FIGS. 5, 8 and 9, shown as step S72, a photoresist shielding layer 25 is disposed on the bottom 2312 of the fixed layer 231 first, and then the conductors 21 are disposed in the through holes 2313 of the fixed layer 231, and first ends 211 of the conductors 21 are in contact with the carrying piece 24, and second ends 212 of the conductors 21 are exposed on the bottom 2312 of the fixed layer 231. The conductors 21 are made by a metallic film deposition method (e.g. sputter deposition/coating, deposition or plating). The shape of the conductors 21 is T-shaped in the direction of FIG. 9, but it is inverted T-shaped in the direction of FIG. 1, and is only a change of direction, but does not affect the actual function. After the conductors 21 and the fixed layer 231 are completed, the manufacture of the conductor structure 23 is completed. Also, as shown in FIG. 10, the photoresist shielding layer 25 is removed.

Figure 11:
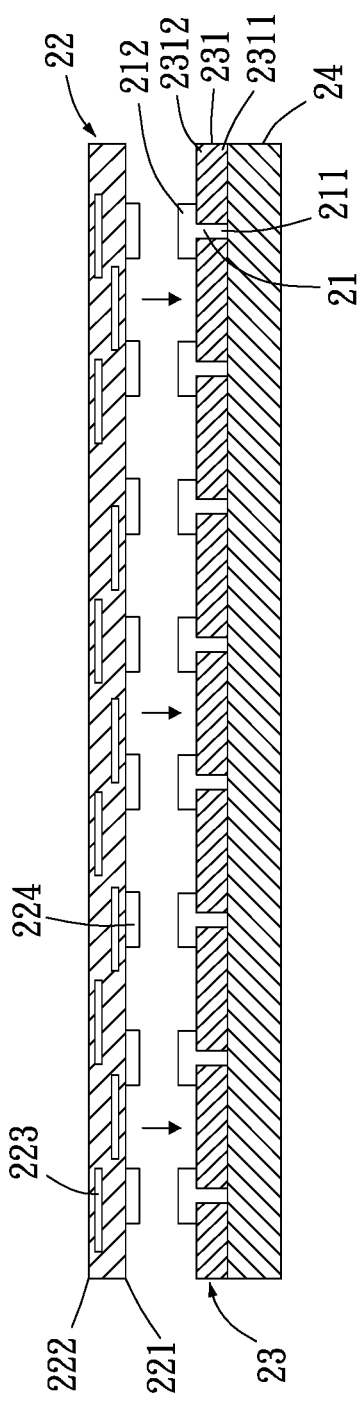
FIG. 11 is a schematic flow sheet of a sixth fabrication of the chip structure of the present disclosure.
Figure 12:
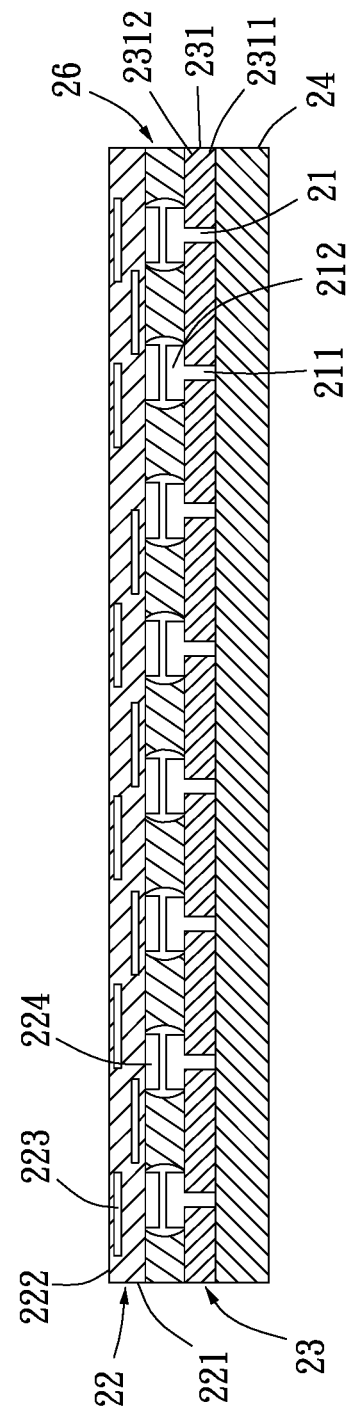
FIG. 12 is a schematic flow sheet of a seventh fabrication of the chip structure of the present disclosure.

Referring to FIGS. 5, 11 and 12, the bridge chip 22 combines to the conductor structure 23, shown as step S73, the top 221 of the bridge chip 22 is disposed on the bottom 2312 of the fixed layer 231, so that the second ends 212 of the conductors 21 electrically connect to the corresponding contacts 224 of the bridge chip 22. In order to enhance the binding strength of the bridge chip 22 with the conductor structure 23 and provide sufficient support, a conductive connection layer 26 is further disposed between the bridge chip 22 and the conductor structure 23, the conductive connection layer 26 comprises a plurality of electrical connection pieces 261 and an insulating support 262, and the electrical connection pieces 261 are respectively electrically connected to the corresponding second ends 212 on the conductors 21 and the corresponding contacts 224 of the bridge chip 22, the insulating support 262 shores up between the bridge chip 22 and the conductor structure 23.

Figure 13:
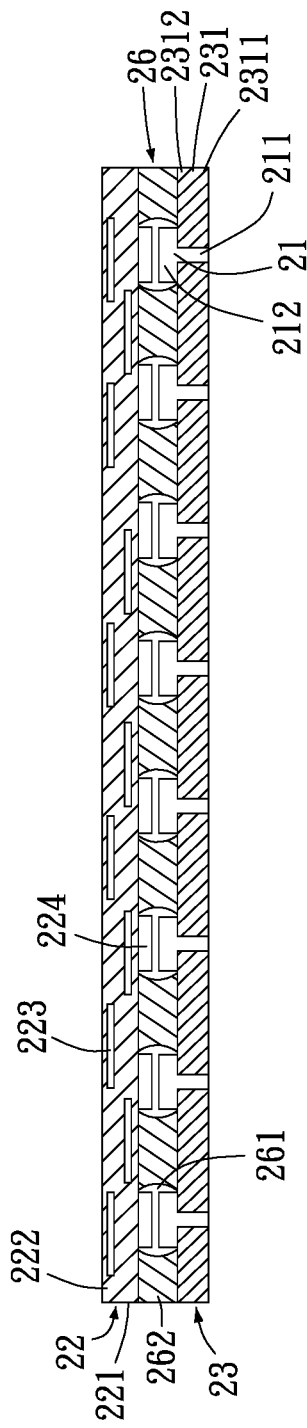
FIG. 13 is a schematic flow sheet of an eighth fabrication of the chip structure of the present disclosure.
Figure 14:
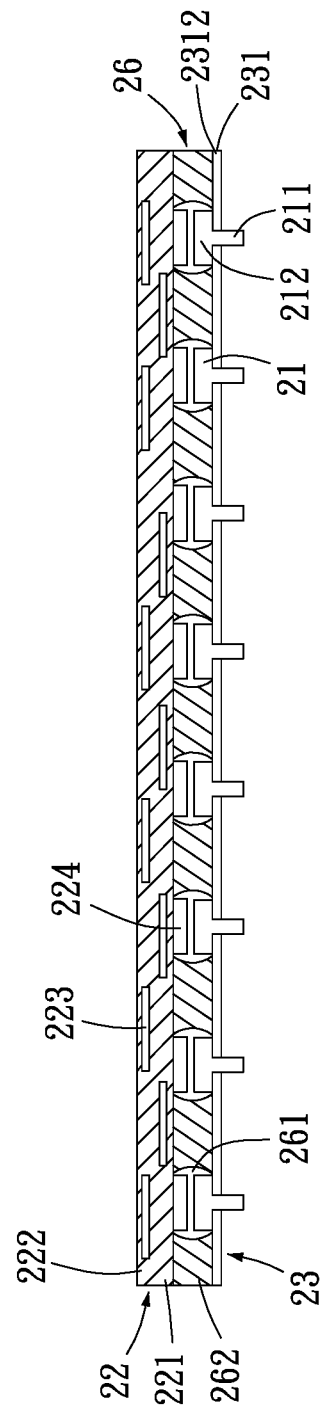
FIG. 14 is a schematic flow sheet of a ninth fabrication of the chip structure of the present disclosure.

Further, referring to FIGS. 5 and 13, shown as step S74, the carrying piece 24 is removed, wherein the method for removing the carrying piece 24 is, for example, a lift off process such as laser or etching. Referring to FIGS. 5 and 14 again, after the carrying piece 24 is removed, shown as step S75, the top 2311 of the fixed layer 231 is removed to expose the first ends 211 of the conductors 21, wherein the top 2311 of the fixed layer 231 can be removed by dry etching or wet etching. The fabrication of the chip structure 20 is completed by a semiconductor process shown as the above steps S71 to S75. The chip structure 20, which is pre-made and equipped with the conductors 21, can effectively enhance the efficiency of fabrication, precision and reliability of the substrate structure of the present invention.

Figure 15:
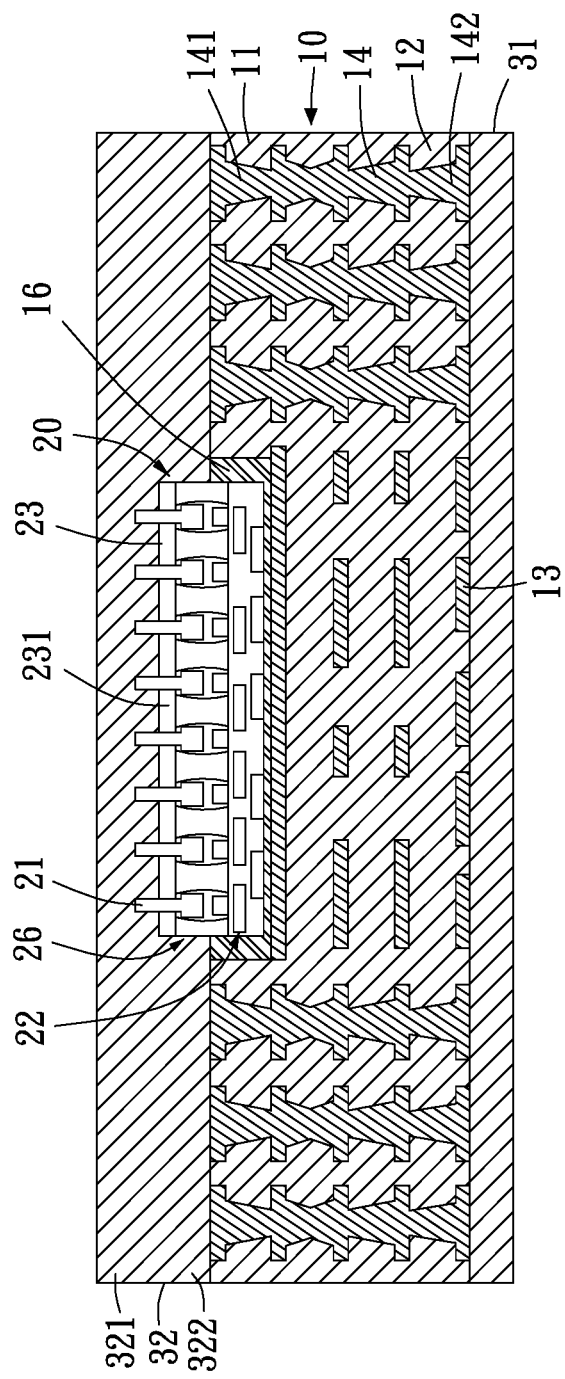
FIG. 15 is a schematic view of a second dielectric layer disposed on the carrier structure and the chip structure of the present disclosure.

After the fabrication of the chip structure 20 according to the above description is illustrated, in the embodiment, referring to FIGS. 2 and 15, in step S64, the second dielectric layer 32 is disposed on the top 11 of the carrier structures 10 and on the chip structure 20. The first ends 141 of the second circuit 14 of the carrier structure 10 and the chip structure 20 are covered through the second dielectric layer 32 to achieve the protective effect, and the binding strength of the chip structure 20 and the carrier structure 10 is also strengthened.

In the embodiment, the second dielectric layer 32 may be a dielectric oxide film (e.g. silicon dioxide, etc.), an epoxy resin, etc., and is made by a film fabricating method (e.g. sputter deposition/coating, deposition or coating).

Figure 16:
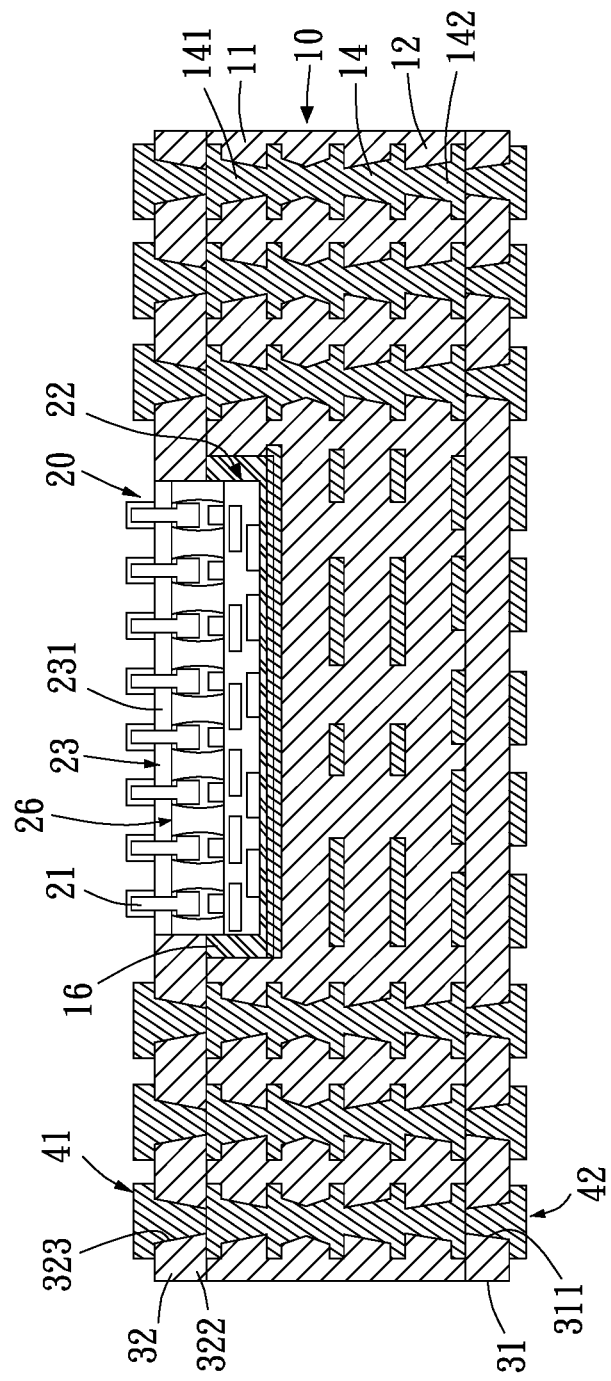
FIG. 16 is a schematic view of a first circuit build-up structure and a second circuit build-up structure disposed on the carrier structure of the present disclosure.

After the second dielectric layer 32 is disposed, the first ends 141 of the second circuits 14 of the carrier structure 10 and the conductors 21 of the chip structure 20 are exposed, in order to connect with other external components, referring to FIGS. 2, 15 and 16. The second dielectric layer 32 has a top 321 and a bottom 322 which are opposite, and referring to step S65, the top 321 of the second dielectric layer 32 is removed, and a plurality of holes 323 are formed on the bottom 322 of the second dielectric layer 32 that correspond to the first ends 141 of the second circuits 14 of the carrier structure 10, so that the conductors 21 of the chip structure 20 and the first ends 141 of the second circuits 14 of the carrier structure 10 are exposed on the second dielectric layer 32. The first circuit build-up structure 41 is disposed on the bottom 322 of the second dielectric layer 32 and the plurality of holes 323, the conductors 21 of the chip structure 20 and the first ends 141 of the second circuits 14 of the carrier structure 10, and the first circuit build-up structure 41 electrically connects the conductors 21 of the chip structure 20 and the corresponding first ends 141 of the second circuits 14 on the carrier structure 10. In the embodiment, after the top 321 of the second dielectric layer 32 is first removed by a dry etching or wet etching, then the holes 323 are formed on the bottom 322 of the second dielectric layer 32 by laser drilling that correspond to the first ends 141 of the second circuits 14 of the carrier structure 10.

After the fabrication of the first circuit build-up structure 41 is completed, further referring to FIGS. 2 and 16, shown as step S66, a plurality of holes 311 are formed on the first dielectric layer 31 that correspond to the second ends 142 of the second circuits 14 of the carrier structure 10, so that the second ends 142 of the second circuits 14 of the carrier structure 10 are exposed on the first dielectric layer 31 through the plurality of holes 311 of the first dielectric layer 31. Next, the second circuit build-up structure 42 is disposed on the first dielectric layer 31 and the second ends 142 of the second circuits 14 of the carrier structure 10, and the second circuit build-up structure 42 electrically connects to the corresponding second ends 142 of the second circuits 14 on the carrier structure 10. The second circuit build-up structure 42 electrically connects to the first circuit build-up structure 41 through the second circuits 14 of the carrier structure 10. The fabrication of the substrate structure of the invention is completed according to the above steps S61 to S66 of the fabricating method of the invention.

In the embodiment, referring to FIG. 1, an electrical connection layer 51 is further disposed on the carrier structure 10 and the chip structure 20, and the electrical connection layer 51 electrically connects to the corresponding first ends 141 of the second circuits 14 on the carrier structure 10, and electrically connects to the corresponding the conductors 21 of the chip structure 20 for subsequent electrical connection with other components. In the embodiment, the electrical connection layer 51 comprises a plurality of solder dots.

After the fabrication of the substrate structure of the invention is completed, at least one chip 52 is further included if the electrical connection with external components is needed, referring to FIG. 1. In the embodiment, two chips 52 are described but not limited to herein. The chips 52 respectively have multiple contacts 521, one of the chips 52 has a part of the contacts 521 that electrically connect to the corresponding conductors 21 on the chip structure 20 through the corresponding electrical connection layer 51, and the rest of the contacts 521 that electrically connect to the corresponding first ends 141 of the second circuits 14 on the carrier structure 10 through the corresponding electrical connection layer 51. Another chip has a part of the contacts 521 that electrically connect to the corresponding conductors 21 on the chip structure 20 through the corresponding electrical connection layer 51, and the rest of the contacts 521 that electrically connect to the corresponding first ends 141 of the second circuits 14 on the carrier structure 10 through the corresponding electrical connection layer 51.

According to the above description, the chip structure with the conductors that are disposed and made in advance by a semiconductor process is fixed in the holding groove of the carrier structure, and the second dielectric layer 32 is disposed on the top 11 of the carrier structure 10 to protect the chip structure 20, and the conductors 21 of the chip structure 20 are exposed on the second dielectric layer 32. Since it is not necessary to fabricate corresponding laser through holes on the second dielectric layer 32 at the top 11 of the carrier structure 10 by laser drilling, short circuiting of adjacent conductors is prevented or empty conductor connections because of the limits in accuracy of laser drilling and thermal reaming holes in avoided, so as to achieve the purpose of improving reliability and stability.

While the present disclosure has been described by means of specific embodiments, numerous modifications and variations could be made thereto by those skilled in the art without departing from the scope and spirit of the present disclosure set forth in the claims.

What is claimed is:

1. An embedded component substrate structure, comprising:
   a carrier structure, having a top and a bottom which are opposite, and a plurality of first circuits and a plurality of second circuits, wherein the carrier structure is recessed to form a holding groove on the top, the first circuits and the second circuits are disposed within the carrier structure, the second circuits respectively have a first end and a second end which are opposite, the first ends of the second circuits are exposed on the top of the carrier structure, and the second ends of the second circuits are exposed on the bottom of the carrier structure;
   a first dielectric layer, disposed on the bottom of the carrier structure, wherein the second ends of the second circuits of the carrier structure are exposed on the first dielectric layer;
   a chip structure with a plurality of conductors, disposed in the holding groove;
   a second dielectric layer, disposed on the chip structure and the top of the carrier structure, wherein the conductors of the chip structure and the first ends of the second circuits are exposed on the second dielectric layer;
   a first circuit build-up structure, disposed on the second dielectric layer, the conductors of the chip structure and the first ends of the second circuits, wherein the first circuit build-up structure is respectively electrically connected to the corresponding conductors on the chip structure and the corresponding first ends of the second circuits on the carrier structure; and
   a second circuit build-up structure, disposed on the bottom of the carrier structure, and respectively electrically connected to the corresponding second ends of the second circuits on the carrier structure,
   wherein the chip structure comprises:
   a bridge chip, having a top and a bottom which are opposite and a plurality of circuits and a plurality of contacts, wherein the circuits are disposed in the bridge chip, and the contacts are alternately disposed on the top of the bridge chip;
   a conductor structure, having a fixed layer and the conductors, wherein the fixed layer has a top and a bottom which are opposite, the conductors respectively have a first end and a second end which are opposite, and are respectively exposed on the top and the bottom of the fixed layer, the bottom of the conductor structure is disposed on the top of the bridge chip, and the second ends of the conductors respectively electrically connect to the corresponding contacts on the bridge chip.

2. The embedded component substrate structure according to claim 1, further comprising: an adhesive layer, disposed in the holding groove, and the adhesive layer lies between the chip structure and the carrier structure.

3. The embedded component substrate structure according to claim 1, further comprising: an electrical connection layer, disposed on the first circuit build-up structure, and the electrical connection layer respectively electrically connected to the corresponding first ends on the second circuits and the corresponding conductors on the chip structure through the first circuit build-up structure.

4. The embedded component substrate structure according to claim 3, wherein at least one chip is further connected, the chip has a plurality of contacts, and is disposed on the top of the carrier structure, the contacts of the chip respectively electrically connect the corresponding second circuits and the corresponding conductors on the chip structure through the electrical connection layer.

5. A method for manufacturing an embedded component substrate structure, comprising:
   recessing a carrier structure to form a holding groove on a top, wherein the carrier structure has a plurality of first circuits and a plurality of second circuits therein, exposing first ends of the second circuits on the top of the carrier structure, and exposing second ends of the second circuits on a bottom of the carrier structure;
   disposing a first dielectric layer on the bottom of the carrier structure;
   disposing a chip structure with a plurality of conductors in the holding groove of the carrier structure;
   disposing a second dielectric layer on the top of the carrier structure and the chip structure;
   exposing the conductors of the chip structure and the first ends of the second circuits of the carrier structure to the second dielectric layer, and disposing a first circuit build-up structure on the second dielectric layer, the conductors of the chip structure and the first ends of the second circuits of the carrier structure, and electrically connecting the corresponding conductors on the chip structure and the corresponding first ends of the second circuits on the carrier structure; and
   exposing the second ends of the second circuits of the carrier structure to the first dielectric layer, and disposing a second circuit build-up structure on the first dielectric layer and the second ends of the second circuits of the carrier structure, and electrically connecting the second circuit build-up structure to the corresponding second ends of the second circuits on the carrier structure,
   wherein the chip structure comprises a bridge chip and a conductor structure, the bridge chip has a top and a bottom which are opposite and a plurality of circuits and a plurality of contacts, the circuits are disposed in the bridge chip, and the contacts are alternately disposed on the top of the bridge chip, and the conductor structure has a fixed layer and the conductors and steps for forming the chip structure comprise:

disposing the fixed layer on a carrying piece, and forming a plurality of through holes that perforate a top and a bottom of the fixed layer;

disposing the conductors in the plurality of through holes of the fixed layer, wherein first ends of the conductors are respectively in contact with the carrying piece, and second ends of the conductors are respectively exposed on the bottom of the fixed layer;

disposing the top of the bridge chip on the bottom of the fixed layer, and respectively electrically connecting the second ends of the conductors to the corresponding contacts on the bridge chip;

removing the carrying piece; and removing the top of the fixed layer to expose the first ends of the conductors.

6. The method for manufacturing an embedded component substrate structure according to claim 5, wherein before the chip structure is disposed in the holding groove of the carrier structure, an adhesive layer is disposed in the holding groove, and then the chip structure is disposed on the adhesive layer in the holding groove.

7. The method for manufacturing an embedded component substrate structure according to claim 5, further comprising: setting up an electrical connection layer on the first circuit build-up structure.

8. The method for manufacturing an embedded component substrate structure according to claim 7, wherein at least one chip is further included, and the chip has a plurality of contacts, and step for disposing the chip comprises:

disposing the chip on the top of the carrier structure, and respectively electrically connecting the contacts of the chip to the corresponding first ends of the second circuits of the carrier structure and the corresponding conductors of the chip structure through the electrical connection layer.

* * * * *